US009490792B2

(12) United States Patent
Zhao

(10) Patent No.: US 9,490,792 B2
(45) Date of Patent: Nov. 8, 2016

(54) PULSE WIDTH MODULATION WITH EFFECTIVE HIGH DUTY RESOLUTION

(75) Inventor: Bin Zhao, Irvine, CA (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 1337 days.

(21) Appl. No.: 12/703,239

(22) Filed: Feb. 10, 2010

(65) Prior Publication Data

US 2011/0193648 A1    Aug. 11, 2011

(51) Int. Cl.
| | | |
|---|---|---|
| *H03K 7/08* | (2006.01) | |
| *H04N 9/31* | (2006.01) | |
| *H05B 33/08* | (2006.01) | |
| *H02M 1/084* | (2006.01) | |

(52) U.S. Cl.
CPC .............. *H03K 7/08* (2013.01); *H04N 9/3123* (2013.01); *H05B 33/0818* (2013.01); *H05B 33/0845* (2013.01); *H02M 1/084* (2013.01); *Y02B 20/346* (2013.01)

(58) Field of Classification Search
CPC ................ H03K 7/08; H05B 33/0818; H05B 33/0845; H04N 9/3123; H02M 1/084; Y02B 20/346
USPC ............... 345/63, 85, 87, 89, 102, 690, 691; 327/116, 172, 175, 393
See application file for complete search history.

(56) References Cited

U.S. PATENT DOCUMENTS

| | | | |
|---|---|---|---|
| 4,162,444 A | 7/1979 | Rodgers | |
| 4,615,029 A | 9/1986 | Hu et al. | |
| 4,649,432 A | 3/1987 | Watanabe et al. | |
| 4,686,640 A | 8/1987 | Simison | |
| 4,907,862 A | 3/1990 | Suntola | |
| 5,025,176 A | 6/1991 | Takeno | |

(Continued)

FOREIGN PATENT DOCUMENTS

| | | | |
|---|---|---|---|
| JP | 2003332624 A | 11/2003 | |
| JP | 2005116199 A | 4/2005 | |
| WO | 2008124718 A2 | 10/2008 | |

OTHER PUBLICATIONS

Mc Nerney, Tim, "constant-current power supply for Luxeon 5W LED with low-voltage warning and shut-off Software Documentation, as shipped to Mali in first 45 prototypes," Nov. 2004, www.designthatmatters.org/ke/pubs/kled-doc.txt, 5 pages.

(Continued)

*Primary Examiner* — Kumar Patel
*Assistant Examiner* — Amy C Onyekaba

(57) ABSTRACT

A pulse width modulation (PWM) signal generator generates a PWM signal having a specified effective PWM duty resolution for a corresponding cycle window. The PWM signal generator receives an N-bit value representing a duty to be implemented and sets values X and Y to the M least significant bits and the N-M most significant bits, respectively, of the N-bit value. The value M can be determined based on the value N and a maximum implementable frequency of a clock signal used to time the generation of each PWM cycle. The PWM signal generator generates a cycle window of $2^M$ PWM cycles, each PWM cycle of the cycle window having a duty of either Y or Y+1. The number of PWM cycles in the cycle window having the duty Y+1 is based on the value X and the PWM cycles having a particular duty are contiguous within the cycle window.

20 Claims, 7 Drawing Sheets

(56) References Cited

U.S. PATENT DOCUMENTS

| | | | |
|---|---|---|---|
| 5,038,055 | A | 8/1991 | Kinoshita |
| 5,508,909 | A | 4/1996 | Maxwell et al. |
| 5,668,611 | A | 9/1997 | Ernstoff et al. |
| 5,723,950 | A | 3/1998 | Wei et al. |
| 5,844,540 | A | 12/1998 | Terasaki |
| 5,898,329 | A | 4/1999 | Hopkins |
| 6,281,822 | B1 | 8/2001 | Park |
| 6,369,782 | B2 * | 4/2002 | Shigeta .......................... 345/63 |
| 6,864,641 | B2 | 3/2005 | Dygert |
| 6,937,084 | B2 | 8/2005 | Bowling |
| 6,943,500 | B2 | 9/2005 | LeChevalier |
| 6,995,592 | B2 | 2/2006 | Agarwal |
| 7,106,294 | B2 | 9/2006 | Kumamoto et al. |
| 7,126,397 | B1 | 10/2006 | Mok |
| 7,176,948 | B2 | 2/2007 | Lewis |
| 7,262,724 | B2 | 8/2007 | Hughes et al. |
| 7,391,280 | B2 | 6/2008 | Hsu |
| 7,436,378 | B2 | 10/2008 | Ito et al. |
| 7,511,545 | B1 | 3/2009 | Kesler |
| 7,550,932 | B2 | 6/2009 | Kung et al. |
| 7,593,243 | B2 | 9/2009 | Ganev et al. |
| 7,741,885 | B1 | 6/2010 | Guo et al. |
| 7,800,415 | B2 | 9/2010 | Yedevelly et al. |
| 8,358,264 | B2 * | 1/2013 | Nose et al. .................... 345/102 |
| 2003/0160804 | A1 | 8/2003 | Willis et al. |
| 2003/0201986 | A1 | 10/2003 | Willis et al. |
| 2004/0008159 | A1 | 1/2004 | Cunha et al. |
| 2004/0208011 | A1 | 10/2004 | Horiuchi et al. |
| 2004/0232964 | A1 | 11/2004 | Wiktor et al. |
| 2004/0233144 | A1 | 11/2004 | Rader et al. |
| 2004/0251942 | A1 | 12/2004 | Chiu et al. |
| 2005/0275355 | A1 | 12/2005 | Samuelsson |
| 2006/0064609 | A1 | 3/2006 | Bryan |
| 2006/0164142 | A1 * | 7/2006 | Stanley .......................... 327/172 |
| 2006/0186830 | A1 | 8/2006 | Shami et al. |
| 2007/0047272 | A1 * | 3/2007 | Kris ................................ 363/41 |
| 2007/0080911 | A1 | 4/2007 | Liu et al. |
| 2007/0182701 | A1 | 8/2007 | Kim et al. |
| 2007/0253330 | A1 | 11/2007 | Tochio et al. |
| 2008/0054815 | A1 | 3/2008 | Kotikalapoodi |
| 2008/0074381 | A1 | 3/2008 | Kumamoto et al. |
| 2008/0297067 | A1 | 12/2008 | Wang et al. |
| 2009/0073735 | A1 | 3/2009 | Kesler |
| 2009/0128045 | A1 | 5/2009 | Szczeszynski et al. |
| 2009/0187925 | A1 | 7/2009 | Hu et al. |
| 2009/0230874 | A1 | 9/2009 | Zhao et al. |
| 2009/0230891 | A1 | 9/2009 | Zhao et al. |
| 2009/0273288 | A1 | 11/2009 | Zhao et al. |
| 2009/0315481 | A1 | 12/2009 | Zhao |
| 2010/0026203 | A1 | 2/2010 | Zhao et al. |
| 2010/0085295 | A1 | 4/2010 | Zhao et al. |
| 2011/0169679 | A1 | 7/2011 | Teramoto et al. |

OTHER PUBLICATIONS

MAXIM: "Application Note 810, Understanding Flash ADCs," Oct. 2, 2001, 8 pages.

National Semiconductor Data Sheet: "LM3432/LM3432B 6-Channel Current Regulator for LED Backlight Application," May 22, 2008, pp. 1-18.

U.S. Appl. No. 12/537,443, filed Aug. 7, 2009, entitled Pulse Width Modulation Frequency Conversion.

International Application No. PCT/US2009/035284, Search Report and Written Opinion, Oct. 28, 2009, 11 pages.

U.S. Appl. No. 12/537,692, filed Aug. 7, 2009, entitled "Phase-Shifted Pulse Width Modulation Signal Generation".

U.S. Appl. No. 12/625,818, filed Nov. 25, 2009, entitled "Synchronized Phase-Shifted Pulse Width Modulation Signal Generation".

U.S. Appl. No. 12/703,249, filed Feb. 10, 2010, entitled "Duty Transition Control in Pulse Width Modulation Signaling".

Luke Huiyong Chung, Electronic Products: "Driver ICs for LED BLUs," May 1, 2008, 3 pages.

Akira Takahashi, Electronic Products: "Methods and features of LED drivers," Mar. 2008, 3 pages.

U.S. Appl. No. 12/340,985, filed Dec. 22, 2008, entitled "LED Driver With Feedback Calibration".

U.S. Appl. No. 12/326,963, filed Dec. 3, 2008, entitled "LED Driver With Precharge and Track/Hold".

U.S. Appl. No. 12/367,672, filed Feb. 9, 2009, entitled "Configuration for Dynamic Power Control in LED Displays".

U.S. Appl. No. 12/424,326, filed Apr. 15, 2009, entitled "Peak Detection With Digital Conversion".

U.S. Appl. No. 12/504,841, filed Jul. 17, 2009, entitled "Analog-To-Digital Converter With Non-Uniform Accuracy".

U.S. Appl. No. 12/690,972, filed Jan. 21, 2010, entitled "Serial Cascade of Minimum Tail Voltages of Subsets of LED Strings for Dynamic Power Contrl in LED Displays".

U.S. Appl. No. 12/363,607, filed Jan. 30, 2009, entitled "LED Driver With Dynamic Headroom Control".

Texas Instruments Publication, "Interleaved Dual PWM Controller with Programmable Max Duty Cycle," SLUS544A, (UCC28220, UCC28221) Sep. 2003, pp. 1-28.

Non-Final Office Action mailed Oct. 20, 2011 for U.S. Appl. No. 12/537,443, 22 pages.

U.S. Appl. No. 13/025,201, filed Feb. 11, 2011 entitled, "Phase-Shifted Pulse Width Modulation Signal Generation Device and Method Therefor".

PCT Search Report mailed Mar. 28, 2011 for International Application No. PCT/US2010/044067, 3 pages.

Notice of Allowance mailed Oct. 5, 2010 for U.S. Appl. No. 12/537,692, 13 pages.

Ex parte Quayle Action mailed May 31, 2013 for U.S. Appl. No. 13/025,201, 31 pages.

Feng et al., "A New Switched-Capacitor Frequency Modulated Driver for Light Emitting Diodes," Review of Scientific Instruments 78, 114710, American Institute of Physics, 2007, 4 pages.

Tadakuma, S. et al., "Improved PWM Control for GTO Inverters with Pulse Number Modulation," IEEE Transactions on Industry Applications, vol. 32, No. 3. Jun. 1, 1996, 7 pages.

Non-final Office Action mailed May 9, 2012 for U.S. Appl. No. 12/244,796, 36 pages.

Notice of Allowance mailed Jan. 25, 2012 for U.S. Appl. No. 12/537,443, 18 pages.

Notice of Allowance mailed Mar. 22, 2012 for U.S. Appl. No. 12/625,818, 25 pages.

Notice of Allowance mailed Dec. 29, 2011 for U.S. Appl. No. 12/703,249, 24 pages.

Notice of Allowance dated Jul. 25, 2012 in U.S. Appl. No. 12/244,796.

Notice of Allowance dated Jun. 8, 2012 in U.S. Appl. No. 12/537,443.

Notice of Allowance dated Jul. 17, 2013 in U.S. Appl. No. 13/025,201.

\* cited by examiner

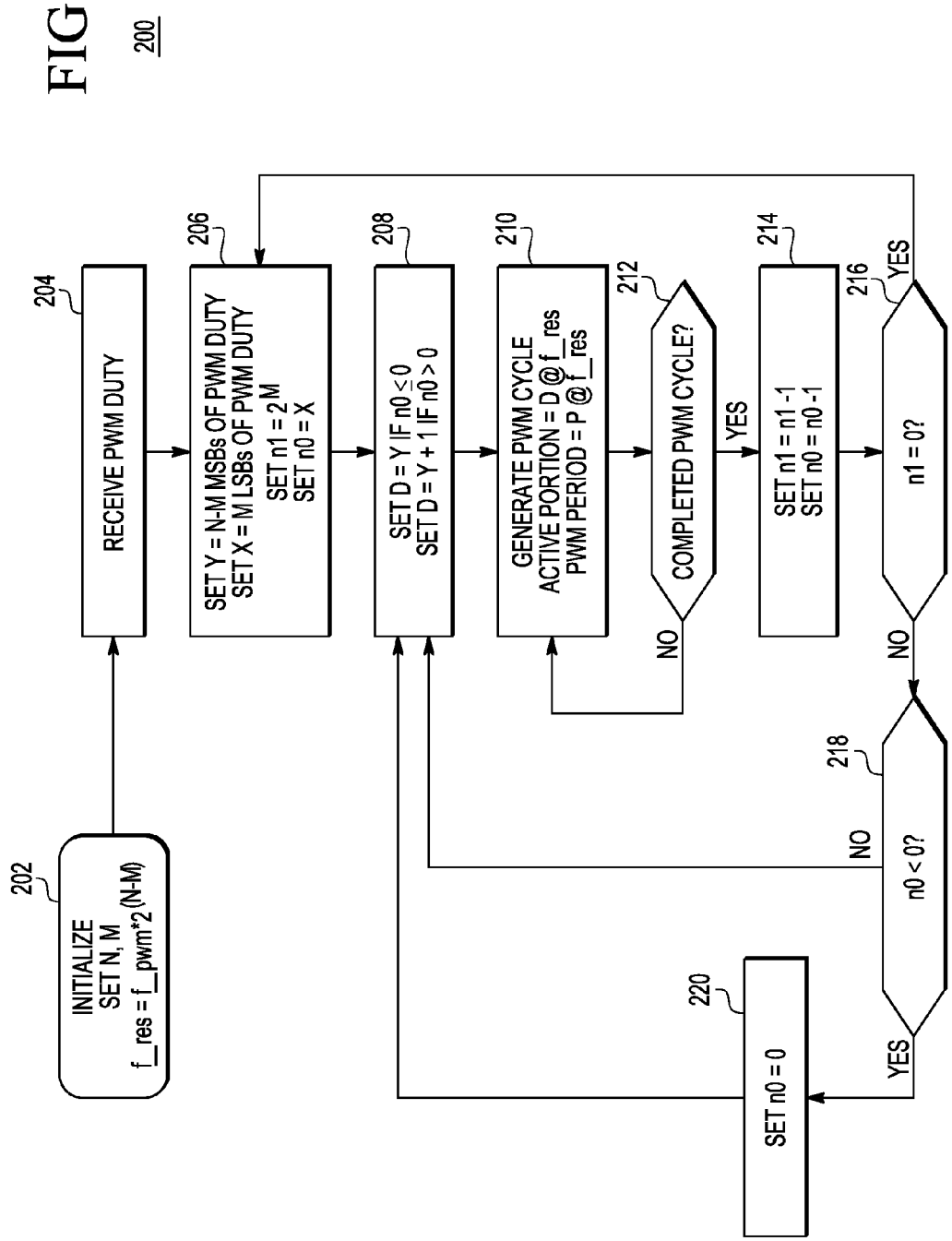

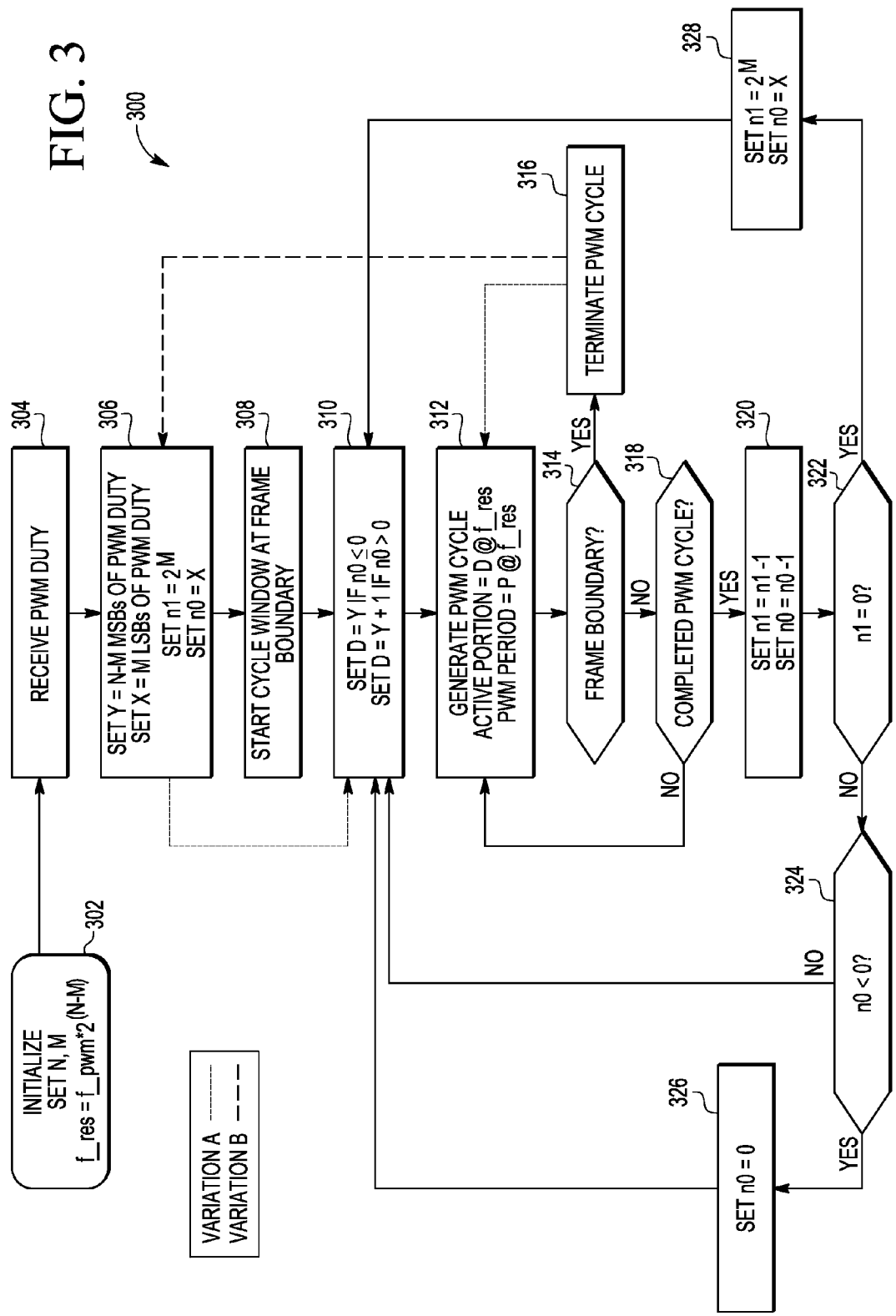

US 9,490,792 B2

PULSE WIDTH MODULATION WITH EFFECTIVE HIGH DUTY RESOLUTION

FIELD OF THE DISCLOSURE

The present disclosure relates generally to pulse width modulation (PWM) signaling and more particularly to controlling a duty of a PWM signal.

BACKGROUND

Pulse width modulation (PWM) signals often are used in display systems for precise control of display backlights or display screens. In order to provide a high degree of control of the duty of the PWM signals so as to obtain a high quality display and to avoid viewer-detectable flickering and other artifacts, PWM signal generators are implemented with increasingly higher duty resolutions. However, these higher resolutions coupled with the high PWM cycle frequencies needed to avoid detectable audible noise result in the use of high clocking frequencies that require considerable power and silicon area to implement. Further, PWM signal generators implementing these high clocking frequencies suffer from increased electromagnetic interference, PWM duty accuracy degradation, and timing issues due to the constrained rising/fall times of the corresponding PWM signaling.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 2 is a flow diagram illustrating a method of operation of the PWM signal generator of FIG. 1 in accordance with at least one embodiment of the present invention.

FIG. 3 is a flow diagram illustrating an alternative method of operation of the PWM signal generator of FIG. 1 in accordance with at least one embodiment of the present invention.

DETAILED DESCRIPTION

FIGS. 1-6 illustrate a pulse width modulation (PWM) signal generator for generating an output PWM signal with an improved effective PWM duty (also commonly referred to as the "duty ratio" or "duty cycle") resolution. The PWM signal generator receives an N-bit binary value representing the duty to be implemented for the output PWM signal. The PWM signal generator sets a value X to the M least significant bits (LSBs) of the N-bit value and sets a value Y to the N-M most significant bits (MSBs) of this N-bit value, where M can be a determined based on the value N and a maximum implementable frequency of a clock signal used to time the generation of each PWM cycle. The PWM signal generator generates a cycle window of $2^M$ PWM cycles in the output PWM signal, each PWM cycle of the cycle window having a duty of either Y or Y+1, whereby the number of PWM cycles in the cycle window having the duty Y+1 is based on the value X. In this manner, the PWM signal generator can be implemented with a native duty resolution of N-M bits while achieving a higher effective resolution when the duty of the PWM cycles in the cycle window are averaged over the duration of the cycle window.

Figure 1:
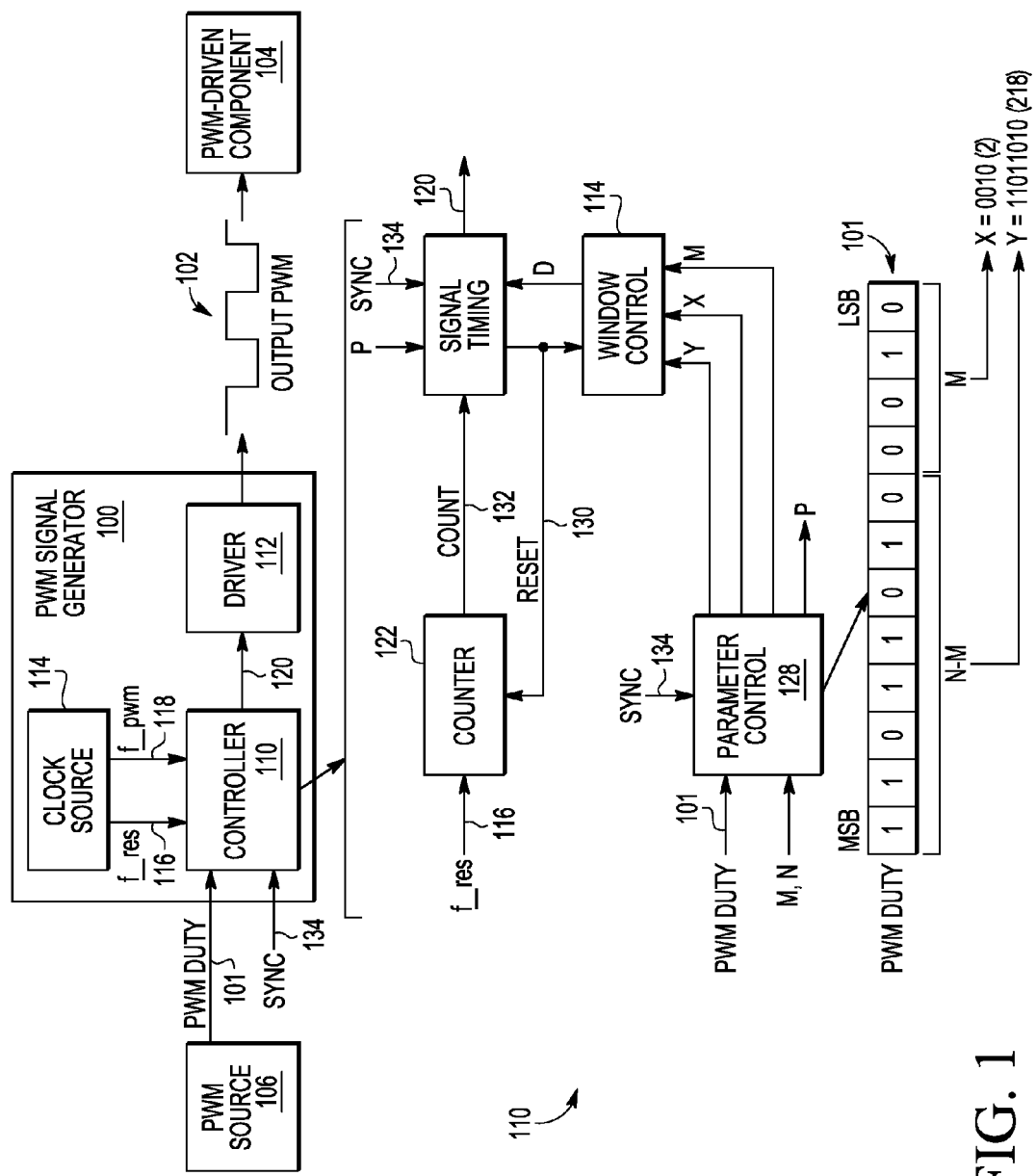
FIG. 1 is a diagram illustrating a pulse width modulation (PWM) signal generator implementing a contiguous duty pattern technique for providing an improved effective duty resolution in accordance with at least one embodiment of the present invention.

FIG. 1 illustrates a PWM signal generator 100 in accordance with at least one embodiment of the present disclosure. The PWM signal generator 100 receives a PWM duty value 101 and generates a sequence of PWM cycles having a duty corresponding to the PWM duty value 101 for an output PWM signal 102. The output PWM signal 102 then may be used to drive or otherwise control the operation of one or more PWM-driven components 104. Although FIG. 1 illustrates a single output PWM signal 102 generated by the PWM signal generator 100 from the PWM duty value 101 for ease of illustration, any number of output PWM signals may be generated in parallel in accordance with the techniques described herein.

The PWM-driven component 104 can include, for example, light emitting diodes (LEDs) of a LED-based display, a digital micromirror device, or an electronic motor. The PWM duty value 101 is provided by a PWM source 106, which can include, for example, a video processing device or a graphics processor for a context whereby the PWM duty value 101 is used to control a backlight intensity or screen intensity of a display. As another example, the PWM source 106 can include a microcontroller for a context whereby the PWM duty value 101 is used to control a speed of a motor.

In the illustrated embodiment, the PWM signal generator 100 includes a controller 110, a driver 112, and a clock source 114. The clock source 114 includes one or more oscillators, frequency dividers, or other clock generation circuits to generate a timing clock signal 116. The timing clock signal 116 has a frequency f_res and is used to time the generation of the active portions of PWM cycles of the output PWM signal 102. Further, in one embodiment, the clock source 114 generates a PWM cycle clock signal 118 that has a frequency f_pwm that represents the period or duration of each PWM cycle. As described in greater detail herein, in one embodiment the relationship between the frequency f_res and f_pwm is based on a programmable value M that controls the number of PWM cycles to be implemented in a cycle window. In an alternative embodiment, the period of the PWM cycles is defined by a value P determined by the PWM signal generator 100, such that the PWM cycles in the cycle window have a period of (1/f_res)*P and a PWM cycle frequency f_pwm=f_res/P. As described in greater detail herein, the value P can be determined as $P=2^{(N-M)}$.

The driver 112 includes an input to receive a control signal 120 and an output to provide the output PWM signal 102, whereby the driver 112 pulls the output PWM signal 102 to either a high reference voltage (e.g., Vdd or logic "1")

or to a low reference voltage (e.g., Vss or logic "0") responsive to the state of the control signal 120.

The controller 110 uses the timing clock signal 116, the PWM duty value 101, and the selected value M to control the state of the control signal 120; that is, to control the driver 112 in generating the output PWM signal 102. The functionality of controller 110 can be implemented as an application specific integrated circuit (ASIC), one or more processors that execute software representative of the corresponding functionality, or a combination thereof. To illustrate, the controller can be implemented as discrete logic, an application specific integrated circuit (ASIC) device, a field programmable gate array (FPGA), and the like.

In the depicted example, the controller 110 includes a counter 122, a signal timing module 124, a window control module 126, and a parameter control module 128. The counter 122 includes an input to receive the timing clock signal 116, an input to receive a reset signal 130, and an output to provide a count value 132, whereby the counter 122 adjusts the count value 132 for each clock cycle of the timing clock signal 116, and whereby the counter 122 resets the count value 132 to a predetermined value, such as zero, in response to an assertion of the reset signal 130. The adjustment to the count value 132 in response to the timing clock signal 116 can include incrementing or, alternatively, decrementing the count value 132 at the frequency f_res.

The signal timing module 124 includes inputs to receive the count value 132, a value P, a value D, and includes an output to provide the control signal 120 based on the relationship between the input values. The value D represents the duration, as measured by clock cycles of the timing clock signal 116, of the active portion of a corresponding PWM cycle to be generated. The value P represents the duration, as measured by clock cycles of the timing clock signal 116, of the period of the corresponding PWM cycle to be generated. Accordingly, to generate a PWM cycle in the output PWM signal 102, the signal timing module 124 resets the counter 122 to initiate the next PWM cycle, accesses the value D from the window control module 126, and then sets the state of the control signal 120 to a first state so as to direct the driver 112 to pull the output PWM signal 102 to the high reference voltage, thereby initiating the active portion of the PWM cycle. When the count value 132 reaches the accessed value D, the signal timing module 124 sets the state of the control signal 120 to a second state so as to direct the driver 112 to pull the output PWM signal 102 to low voltage reference, thereby terminating the active portion of the PWM cycle. When the count value 132 reaches the value P, the PWM cycle has completed and the signal timing module 124 therefore asserts the reset signal 130 to reset the counter 122 and initiate generation of the next PWM cycle. Accordingly, the generated PWM cycle has a duty ratio of D:P. In an alternative embodiment, rather than determining and using the value P to time PWM cycle periods, the PWM cycle clock signal 118 is used by the signal timing module 124 to time PWM cycle periods.

The parameter control module 128 receives and buffers the PWM duty value 101 and the selected value M, which sets the number of PWM cycles to be implemented in a cycle window as $2^M$ PWM cycles per cycle window. The parameter control module 128 further has access to a value N that represents the native resolution of the PWM duty value 101; that is, the value N represents the number of bits in the PWM duty value 101. Using the PWM duty value 101 and the values M and N, the parameter control module 128 determines two non-negative integer values, X and Y, whereby the value X is set as the M least significant bits (LSBs) of the PWM duty value 101 and the value Y is set as the N-M most significant bits (MSBs) of the PWM duty value 101. As illustrated by FIG. 1, for M=4 and a twelve-bit duty resolution (i.e., N=12), an example PWM duty value 101 of PWM_DUTY[(N-1):0]=110110100010b would result in a value for value X of PWM_DUTY[(M-1):0]=0010b, or 2 in decimal format, and a value for value Y of PWM_DUTY[(N-1):M]=11011010b, or 218 in decimal format. As described in greater detail below, the values Y and Y+1 are used as measures of the duties (e.g., in terms of cycles of the timing clock signal 116) of respective PWM cycles of the cycle window and the value X is used as the measure of the number of PWM cycles in the cycle window that are to have the duty Y+1. The parameter control module 128 further provides the value P, which represents the period of the PWM cycles in the cycle window, to the signal timing module 124 for use in timing the period of each PWM cycle in the cycle window. In one embodiment, the value P is set by the parameter control module 128 as $P=2^{(N-M)}$ cycles of the timing clock signal 116.

The window control module 126 includes inputs to receive the values X, Y, and M from the parameter control module 128, an input to receive the reset signal 130, and an output to provide a select one of the value Y or the value Y+1 as the value D to the signal timing module 124 for use in setting the duty of a corresponding PWM cycle in the cycle window. As noted above, the value X represents the number of PWM cycles in the cycle window that are to have the duty Y+1, and thus the value $2^M-X$ represents the number of PWM cycles in the cycle window that are to have the duty Y. In one embodiment, the PWM cycles having the duty Y+1 are generated contiguously at the front, or beginning, of a cycle window. Alternatively, the PWM cycles having the duty Y+1 are generated contiguously together at the rear, or end, of a cycle window. The grouping of PWM cycles contiguously within a cycle window by duty so that the PWM cycles with the duty Y+1 occur at the front or rear of a cycle window can reduce the power consumed by the PWM signal generator 100 because only a single switch of the latch or latches storing the value D is needed for the single change between the duty Y and the duty Y+1 during a given cycle window.

In an implementation whereby the PWM cycles having the duty Y+1 are grouped contiguously at the front of the cycle window, the particular one of the value Y or the value Y+1 that is provided as the value D depends on whether a number of PWM cycles having the duty Y+1 that already have been generated in the cycle window has reached the value X, which was determined from the M least-significant bits of the PWM duty value 101. In this embodiment, the window control module 126 sets a cycle count value n0 to the value X at the start of the cycle window and decrements n0 as each PWM cycle of the cycle window is completed, as indicated by a corresponding assertion of the reset signal 130 from the signal timing module 124. While the cycle count value n0 is greater than zero, the window control module 126 provides the value Y+1 as the value D, thereby causing the signal timing module 124 to generate a corresponding PWM cycle having the duty Y+1. Once the cycle count value n0 reaches zero during the cycle window, then the intended number of PWM cycles having the duty Y+1 have been generated for the cycle window (that is, X PWM cycles with the duty Y+1 have been created), and thus the window control module 126 switches to providing the value Y as the value D so that the remaining PWM cycles of the cycle window are generated with the duty Y.

In an implementation whereby the PWM cycles having the duty Y+1 are grouped contiguously at the rear of the cycle window, the window control module 126 sets the cycle count value n0 to the value $2^M-X$ at the start of the cycle window and decrements n0 as each PWM cycle of the cycle window is completed as indicated by a corresponding assertion of the reset signal 130 from the signal timing module 124. While the cycle count value n0 is greater than zero, the window control module 126 provides the value Y as the value D, thereby causing the signal timing module 124 to generate a corresponding PWM cycle having the duty Y. Once the cycle count value n0 reaches zero during the cycle window, then the intended number of PWM cycles having the duty Y have been generated for the cycle window (that is, $2^M-X$ PWM cycles with the duty Y have been created), and thus the window control module 126 switches to providing the value Y+1 as the value D so that the remaining PWM cycles of the cycle window are generated with the duty Y+1.

As noted above, the PWM signal generator 100 can be used for PWM control in display systems, such as for generating the PWM signals used to control backlighting or display screens. In many display systems, it is advantageous to synchronize the PWM cycles of the PWM signals to the frame boundaries of the displayed video content. In such instances, the PWM source 106 or another video component can provide a synchronization (SYNC) signal 134, such as a vertical synchronization (VSYNC) signal that is representative of the frame boundaries in the corresponding displayed video content. The PWM signal generator 100 then may alter its operation in responsive to the frame boundaries so as to prematurely terminate a PWM cycle being generated therein and then initiate a new PWM cycle in response to the occurrence of a frame boundary.

Updates to the PWM duty value may be implemented in accordance with at least three approaches. In one approach, when an update to the PWM duty value 101 occurs during a cycle window, the consequence of the update (that is, the corresponding change in the PWM output) is delayed and not implemented until the next cycle window. Alternatively, the SYNC signal 134 can be used to time the implementation of updates to the PWM duty value. Thus, in a second approach, when an update to the PWM duty value 101 occurs during a cycle window, the consequence of the update does not appear in the output PWM signal 102 until the SYNC signal 134 is asserted. In a third approach, an update to the PWM duty value 101 is implemented in the following PWM cycle, and an assertion of the SYNC signal 134 serves to terminate the current PWM cycle being generated and start a new PWM cycle. Thus, in the third approach PWM duty updates occur on a PWM cycle basis, and the assertion of the SYNC signal 134 serves to trigger, in effect, a PWM cycle phase change.

FIG. 2 illustrates an example method 200 of operation of the PWM signal generator 100 in accordance with at least one embodiment of the present disclosure. At block 202, the controller 110 initializes in preparation for operation. This initialization process includes, for example, determining and setting the value M, which represents the number of PWM cycles to be implemented in a cycle window as $2^M$ PWM cycles and determining the value N, which represents the number of bits, or resolution, of the PWM duty value 101. One or both of the values M and N can be hard-coded by a manufacturer or provider of the device implementing the PWM signal generator 100. Alternatively, the value M can be programmable via, for example, a register or using a particular resistance at an external pin of the device.

In one embodiment, the value M is selected so as to meet two conditions. The first condition sets a minimum value for M based on the value N and a maximum implementable frequency of the timing clock signal 116 as dictated by, for example, budgeted silicon area, budgeted power consumption, or other design considerations. The second condition sets a maximum value for M so as to avoid visibly-detectable variation due to the resulting cycle window frequency. In particular, the parameter control module 128 or other component of the PWM signal generator 100 can determine a value for M that meets these two conditions by selecting a value for M that falls within a range determined based on calculations representing an expression:

$$\frac{\log\left(\frac{f\_pwm}{vis\_thresh}\right)}{\log(2)} > M \geq N - \frac{\log\left(\frac{f\_res\_max}{f\_pwm}\right)}{\log(2)} \qquad \text{EQ. 1}$$

whereby N represents the native resolution of the PWM signal generator 100 (that is, the number of bits in the PWM duty value 101), f_res_max represents the maximum implementable frequency of the timing clock signal 116, vis_thresh represents a minimum cycle window frequency (e.g., 50 Hz) above which variations due to changes within a cycle window are not expected to be detected by a typically viewer, and f_pwm represents the PWM cycle frequency, which can be represented either as the frequency of the PWM cycle clock signal 118 in the event that the PWM cycle clock signal 118 is used to time PWM cycles, or as f_res/P in the event that the value P is used to time PWM cycles.

The initialization process further can include configuring a frequency divider, phase-locked loop, or other clocking circuit of the clock source 114 to generate the timing clock signal 116 so that the frequency f_res of the timing clock signal 116 is based on or otherwise related to the frequency f_pwm. In one embodiment, this relationship between the frequency f_res and the frequency f_pwm is set based on the relationship: $f\_res=f\_pwm*P=f\_pwm*2^{(N-M)}$. As such, a timing clock signal 116 having a lower frequency can be used compared to a conventional direct control approach in which the timing frequency typically would be $f\_res=f\_pwm*(2^N-1)$.

At block 204, the PWM source 106 provides a value PWM_DUTY[(N−1):0] as the PWM duty value 101 to the controller 110. In response, at block 206 the controller 110 sets the value X to the M LSBs of the PWM duty value 101 (that is, X=PWM_DUTY[(M−1):0]), sets the value Y to the N-M MSBs of the PWM duty value 101 (that is, Y=PWM_DUTY[(N−1):M]), sets the cycle count value n1 to $2^M$ (that is, $n1=2^M$), and initially sets the cycle count value n0 to X (that is, n0=X). With these values set, the controller 110 begins generating the $2^M$ PWM cycles in the cycle window.

As noted above, the value D represents the duty of the next PWM cycle to be generated, whereby the value D is selectively set to either Y or Y+1. As also noted above, the value X represents the total number of PWM cycles of a cycle window that are to have the duty Y+1. As n0 is initially set to the value X, n0 serves as a decrement counter used to count the number of PWM cycles with the duty Y+1 that have been generated in the current cycle window. In one embodiment, the controller 110 is configured to generate the X PWM cycles having the duty Y+1 together as a contiguous group at the front of the cycle window. Accordingly, at block 208 the controller 110 compares the cycle count value n0 to 0. If n0 is greater than 0, then fewer than X PWM cycles having the duty Y+1 have been generated for the cycle window thus far. Accordingly, the controller 110 sets the value D to Y+1 so that the next PWM cycle to be generated has the duty Y+1. If n0 is not greater than 0, then X PWM cycles having the duty Y+1 have been generated for the cycle window and thus no further PWM cycles having the duty Y+1 are to be generated for the cycle window. In this instance, the controller 110 sets the value D to Y so that the next PWM cycle to be generated has the duty Y.

At block 210 the controller 110 controls the driver 112 so as to generate a PWM cycle having a duty represented by the value D (whereby D can be either Y or Y+1 depending on the corresponding iteration of block 208). In one embodiment, the value D represents the duration of the active portion of the PWM cycle and the value P represents the period of the PWM cycle as measured in cycles of the timing clock signal 116. Accordingly, the controller 110 can use the count value 132 of the counter 122 and the values P and D to time the generation of the PWM cycle so as to have a duty ratio of D:P.

In response to the controller 110 determining at block 212 that generation of the PWM cycle has completed, at block 214 the controller 110 decrements the values n0 and n1 to reflect that another PWM cycle of the cycle window has completed. At block 216, the controller 110 determines whether the cycle window has completed by comparing the cycle count value n1 to zero. If the controller 110 determines at block 216 that the cycle count value n1 has not yet reached zero and thus the cycle window has not completed, at block 218 the controller 110 determines whether X PWM cycles having the duty Y+1 have been generated for the cycle window by determining whether the cycle count value n0 is less than zero. If so, the controller 110 can set the cycle count value n0 to zero at block 220 so that the value D is set to Y at the next iteration of block 208 for the remaining PWM cycles of the cycle window. Otherwise, if the cycle count value n0 is not less than zero, one or more PWM cycles having the duty Y+1 remain to be generated in the current cycle window and thus the controller 110 returns to block 208 without modifying the cycle count value n0 so that the value D is set to Y+1 at the next iteration of block 208.

Returning to block 216, in the event that the cycle count value n1 has reached zero, the cycle window has completed and thus the operation of the controller 110 returns to the initialization process of block 206 for the next cycle window, which may use an updated value for PWM duty value 101 in the event that an update to the PWM duty value 101 occurred during generation of the previous cycle window.

FIG. 3 illustrates an example method 300 of operation of the PWM signal generator 100 that is synchronized to frame boundaries or other frame synchronization events in accordance with at least one embodiment of the present disclosure. The method 300 includes two variations, identified as "Variation A" and "Variation B" in FIG. 3, representing different example responses to frame boundaries represented by assertions of the SYNC signal 134.

At block 302, the controller 110 initializes in preparation for operation in the manner described above with respect to block 202. At block 304, the PWM source 106 provides a value PWM_DUTY[(N−1):0] as the PWM duty value 101 to the controller 110. In response, at block 306 the controller 110 sets the value X to PWM_DUTY[(M−0:0], sets the value Y to PWM_DUTY[(N−1):M], sets the cycle count value n1 to $2^M$, and initially sets cycle count value n0 to X (that is, n0=X). With these values set, for variation B the controller 110 waits until the next frame boundary at block 308, as indicated by an assertion of the SYNC signal 134, and then begins generating the $2^M$ PWM cycles of the cycle window. For Variation A, the controller 110 initiates generation of the $2^M$ PWM cycles of the cycle window without waiting for next frame boundary.

At block 310 the controller 110 compares the cycle count value n0 to 0. If n0 is greater than 0, fewer than X PWM cycles having the duty Y+1 have been generated for the cycle window thus far. Accordingly, the controller 110 sets the value D to Y+1 so that the next PWM cycle to be generated has the duty Y+1. If n0 is not greater than 0, then X PWM cycles having the duty Y+1 have been generated for the cycle window and thus no further PWM cycles having the duty Y+1 are to be generated for the cycle window. In this instance, the controller 110 sets the value D to Y so that the next PWM cycle to be generated has the duty Y. At block 312 the controller 110 accesses the current value for D and controls the driver 112 so as to generate a PWM cycle having a duty represented by the value D (whereby D can be either Y or Y+1 depending on the result of the corresponding iteration of block 310).

In one embodiment, the occurrence of a frame boundary causes the controller 110 to terminate the PWM cycle being generated and to start a new PWM cycle thereafter, thereby synchronizing the PWM cycles to the frame boundaries. Accordingly, while the PWM cycle is being generated at block 312, the controller 110 monitors the SYNC signal 134 at block 314 to detect an occurrence of a frame boundary and terminates the PWM cycle being generated at block 316 in response to the frame boundary. In one variation of method 300 (identified as "Variation A" and by the lines from block 306 to block 310 and from block 316 to block 312 in FIG. 3), updates to the PWM duty value 101 that occur during a cycle window are incorporated in the next PWM cycle of the cycle window by directly updating the values X and Y based on the new PWM duty value and updating n0 based on the new value X as the update to the PWM duty value 101 is received at block 306 and then proceeding back to block 310. In this case, a PWM duty value change caused by a change to the PWM duty value 101 occurs on PWM cycle basis. An assertion of the SYNC signal 134 merely serves to start to the generation of the next PWM cycle, as represented by the flow from block 314 to block 316 and then block 312.

In another variation of method 300 (identified as "Variation B" and the line from block 316 to block 306 in FIG. 3), an update to the PWM output 120 caused by a change to the PWM duty value 101 happens only at a frame boundary. Accordingly, an update to the PWM duty value 101 occurring between frame boundaries is buffered until a frame boundary is detected at block 314, at which point the values X and Y and the cycle count value n0 are updated based on the new PWM duty value 101 as described above at block 306, and the method 300 then proceeds to block 310. As such, the approach of Variation B serves to delay the effect of an update to the PWM duty value 101 in the output PWM signal 102 until the next assertion of the SYNC signal 134 following the update.

Returning to block 314, in the event that no frame boundary occurs before the PWM cycle is determined to be completed at block 318, the controller 110 decrements the cycle count values n0 and n1 at block 320 to reflect that another PWM cycle of the cycle window has completed. At block 322, the controller 110 determines whether the cycle window has completed by comparing the cycle count value n1 to zero. If the controller 110 determines at block 322 that the cycle count value n1 has not yet reached zero and thus the cycle window has not completed, at block 324 the controller 110 determines whether X PWM cycles having the duty Y+1 have been generated for the cycle window by determining whether the cycle count value n0 is less than zero. If so, the controller 110 can set the cycle count value n0 to zero at block 326 so that the value D is set to Y at the next iteration of block 308 for the remaining PWM cycles of the cycle window. Otherwise, if the cycle count value n0 is not less than zero, one or more PWM cycles having the duty Y+1 remain to be generated in the current cycle window and thus the controller 110 returns to block 310 without modifying the cycle count value n0 so that the value D is set to Y+1 at the next iteration of block 310.

Returning to block 322, in the event that n1 has reached zero, the cycle window has completed. Accordingly, the controller 110 resets the cycle count value n1 to $2^M$ and resets the cycle count value n0 to X and begins the next cycle window by returning to block 310. As noted above, an update to the PWM duty value 101 can be directly implemented into a current cycle window or the update may be implemented only at a frame boundary.

Figure 4A:
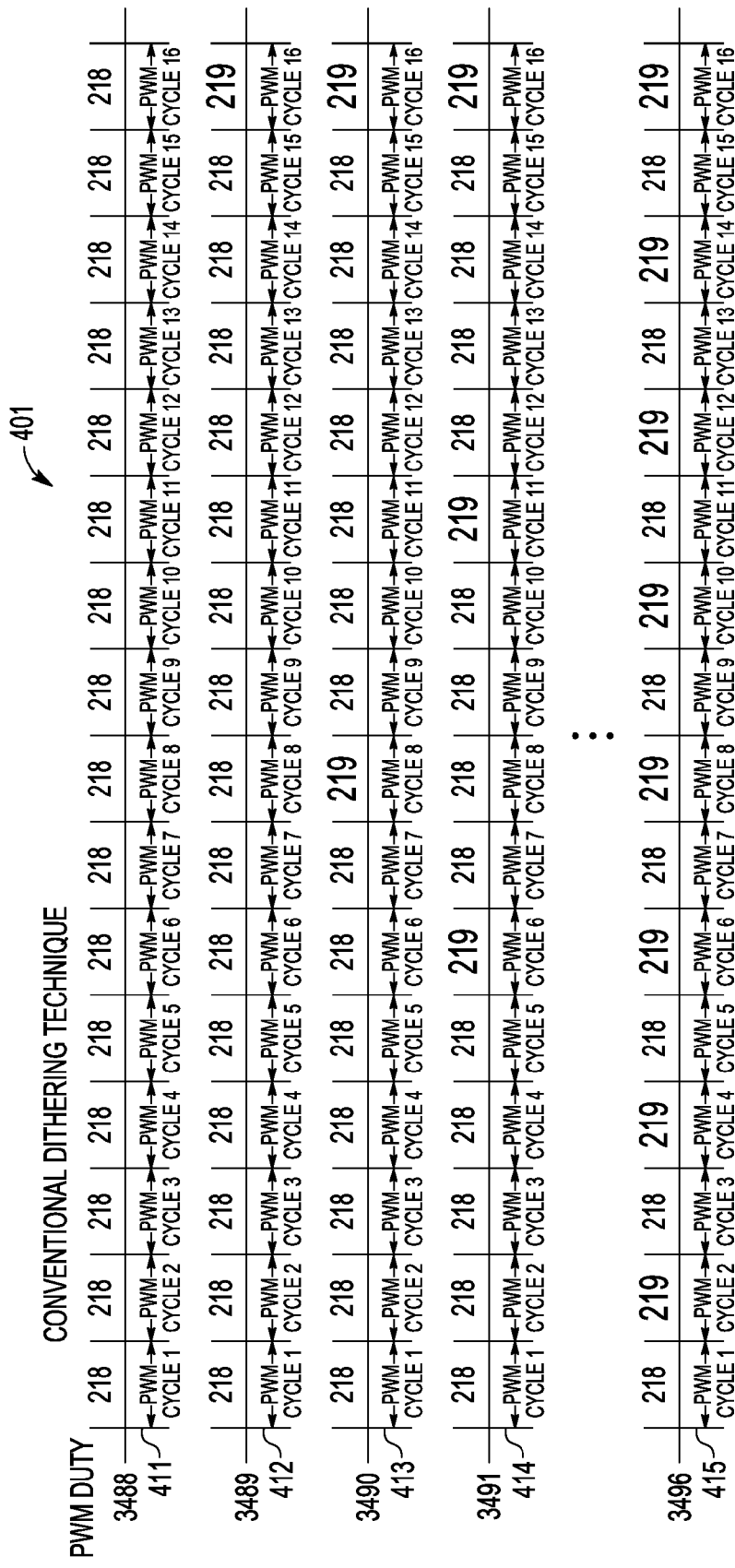
FIG. 4A is a chart illustrating a conventional dithering technique for PWM duty control.
Figure 4B:
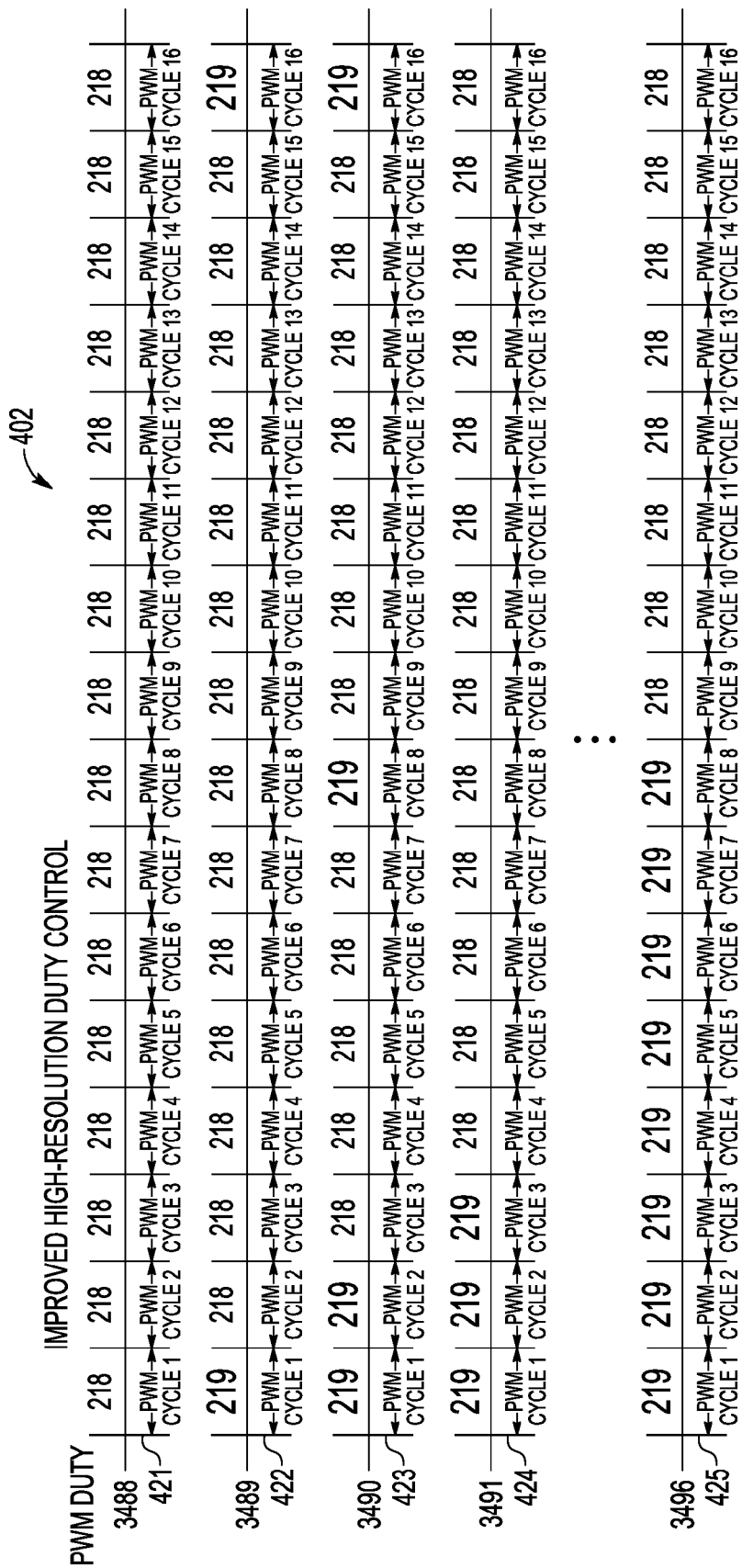
FIG. 4B is a chart illustrating an example of a contiguous duty pattern technique in accordance with at least one embodiment of the present invention.

FIGS. 4A and 4B illustrates an example output of a conventional dithering technique for providing a higher-resolution duty control and an example output of the high-resolution duty control technique described above. The chart 401 of FIG. 4A illustrates an example operation of a conventional dithering technique described in, for example, U.S. Pat. No. 7,391,280 to generate sets 411, 412, 413, 414, and 415 of a series of sixteen PWM cycles for duties of 3488 (110110100000b), 3489 (110110100001b), 3490 (110110100010b), 3491 (110110100011b), and 3496 (110110101000b), respectively. The chart 402 of FIG. 4B illustrates an example implementation of the contiguous duty pattern technique described above to generate cycle windows 421, 422, 423, 424, and 425 of sixteen PWM cycles each for the same five duties.

As illustrated by FIGS. 4A and 4B, both the conventional dithering technique and the contiguous duty pattern technique described above implement a particular proportion of PWM cycles having a duty of 218 (Y) to PWM cycles having a duty of 219 (Y+1) to generate a desired average, or effective, PWM duty over the sixteen PWM cycle range. However, the conventional dithering technique relies on an accumulator and thus the PWM cycles having a duty of 219 are distributed among the sixteen PWM cycles based on the accumulation operation in a substantially non-contiguous manner. In contrast, one embodiment of the technique described above provides that the PWM cycles having a duty of Y+1, or 219 in this example, are contiguously grouped together (for example, at the front or beginning of the cycle window or, alternatively, at the rear or end of the cycle window). To illustrate, the depicted cycle window 425 for the duty 3496 has eight PWM cycles having the duty 219 grouped contiguously at the front of the cycle window 425, whereas the set 415 for the same duty 3496 in the conventional dithering technique has the eight PWM cycles having the duty 219 non-contiguously distributed among the set at PWM cycles 2, 4, 6, 8, 10, 12, 14, and 16. Accordingly, the conventional dithering technique consumes more power due to the frequent context switches in latches and other buffering elements so as to achieve the frequent dithering between a duty of 218 and a duty of 219. In contrast, by grouping the PWM cycles of the same duty contiguously in each PWM cycle window, the illustrated embodiment of an implementation of the high-resolution duty control technique requires only a single context switch between the duty Y and the duty Y+1 at a single point in any given cycle window.

Figure 5:
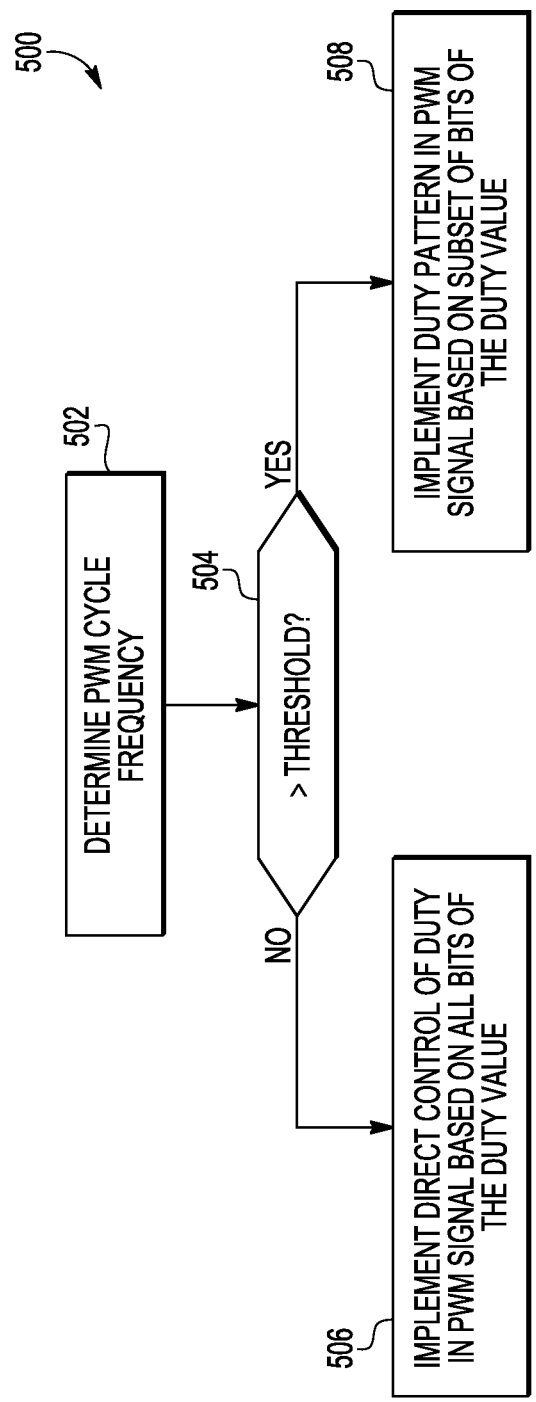
FIG. 5 is a flow diagram illustrating a method for selectively implementing either direct duty control mode or a pattern duty control mode at the PWM signal generator of FIG. 1 in accordance with at least one embodiment of the present disclosure.

FIG. 5 illustrates an example method 500 for controlling a mode of PWM cycle generation for the PWM signal generator 100 of FIG. 1 in accordance with at least one embodiment of the present disclosure. As noted above, the technique of generating a pattern of PWM cycles having duties that switch between Y and Y+1 permits an implementation of an effective duty resolution, when averaged over the cycle window, that is greater than the resolution of the duty value used as the basis for the duties Y and Y+1. Conventional dithering techniques also can provide higher resolution control, albeit at higher power consumption due to the frequent context switching as described above. However, at lower PWM cycle frequencies (that is, PWM cycles per unit time), the switching between the duty Y and the duty Y+1 within the pattern can be detected by the viewer, and thus degrading the quality of the viewer's experience. To illustrate, if the PWM cycle frequency were 100 Hz and the value M was set to 4 (M=4) in the above-described technique, there would be a variation frequency as small as 6.25 Hz (100 Hz/$2^4$) due to the repeated patterns in the cycle windows. This variation frequency is within the detectable range of a typical viewer (i.e., vis_thresh in EQ. 1), which generally is understood to be 50 Hz or lower. Accordingly, as illustrated by method 500, the PWM signal generator 100 can selectively implement one of two modes depending on the PWM cycle frequency: a direct control mode whereby all N bits of the duty value are used to control the duty of the PWM cycles in the output PWM signal 102; and a pattern mode using either a conventional dithering technique or the contiguous pattern technique described above.

At block 502, the PWM signal generator 100 determines the PWM cycle frequency f_pwm of the output PWM signal 102. In one embodiment, the PWM cycle frequency f_pwm is determined from the frequency of the PWM cycle clock signal 118. In another embodiment, the frequency f_pwm is determined from the value P and the frequency f_res of the timing clock signal 116 (that is, f_pwm=f_res/P). At block 504, the PWM signal generator 100 uses the frequency f_pwm to determine whether to operate in the direct control mode or the pattern mode. In the direct control mode, the frequency f_res of the timing clock signal is set to f_res=f_pwm*($2^N$−1) and thus f_pwm=f_res/($2^N$−1). Accordingly, at block 504 the PWM signal generator 100 determines whether the frequency f_res resulting from the frequency f_pwm determined at block 502 would exceed the maximum implementable frequency f_res_max of the clock source 114; that is, the PWM signal generator 100 determines whether f_pwm is less than a threshold determined based on calculations represented by the expression f_res_max/($2^N$−1).

In the event that the PWM cycle frequency is below this threshold (that is, when f_pwm<f_res_max/($2^N$−1)), the direct control mode can be implemented. Accordingly, at block 508 the PWM signal generator 100 is configured to the direct control mode so as to generate for the output PWM signal 102 one or more PWM cycles having a duty represented by all N bits of the PWM duty value 101. For example, in the event that the PWM duty value 101 has a value 3490, then the PWM signal generator 100 would generate one or more PWM cycles having the duty 3490 in the output PWM signal 102.

In one embodiment, the direct control mode can be implemented in the methods 200 and 300 of operation of the PWM signal controller 100 illustrated in FIGS. 2 and 3, respectively, by setting M to 0 at blocks 202 or 302 and setting n0 to 0 and n1 to 1 at blocks 206 or 306 and 328. The effect of setting M to 0 is that the represented algorithms would use all N bits of the PWM duty value 101 as the duty Y (that is, Y=PWM_DUTY[(N−1):0]) and there would be no PWM cycles in the cycle window of Y+1. However, in the instance whereby M is set to 0, the initialization processes of blocks 202 and 302 of methods 200 and 300 are modified so that the frequency f_res of the timing clock signal 116 is set to f_res=f_pwm*($2^N$−1), instead of f_pwm*$2^N$, so as to permit generation of PWM cycles with duties of 100% in the event that the PWM duty value 101 represents a 100% duty.

Returning to block 504, in the event that the PWM cycle frequency is at or above the threshold (that is, when f_pwm>=f_res_max/($2^N$−1)), implementation of the direct control mode would be limited due to power consumption and silicon area considerations. Thus, the PWM signal generator 100 instead can implement a duty pattern-based technique and use a timing clock signal with a frequency f_res that is lower in comparison to the direct control approach. Thus, at block 506 the PWM signal generator 100 is configured to the pattern mode so as to generate for the output PWM signal 102 a series of PWM cycles, whereby the series includes a pattern of one or more PWM cycles having a duty Y and one or more PWM cycles having a duty Y+1, whereby the duty Y is based on a subset of the N bits of the PWM duty value 101. The pattern implemented by the PWM signal generator 100 in this mode can include a contiguous pattern whereby the series of PWM cycles comprises the cycle window described above and the one or more PWM cycles having the duty Y+1 are contiguous within the series/cycle window in accordance with the above-described high-resolution control technique. Alternatively, the pattern implemented by the PWM signal generator 100 in this mode can include a conventional dithering pattern, such as, for example, the accumulation-based dithering approach described in U.S. Pat. No. 7,391,280. In both cases, the value M is selected from the range defined by EQ. 1 above so as to satisfy the two conditions regarding the selection of a value for M.

Figure 6:
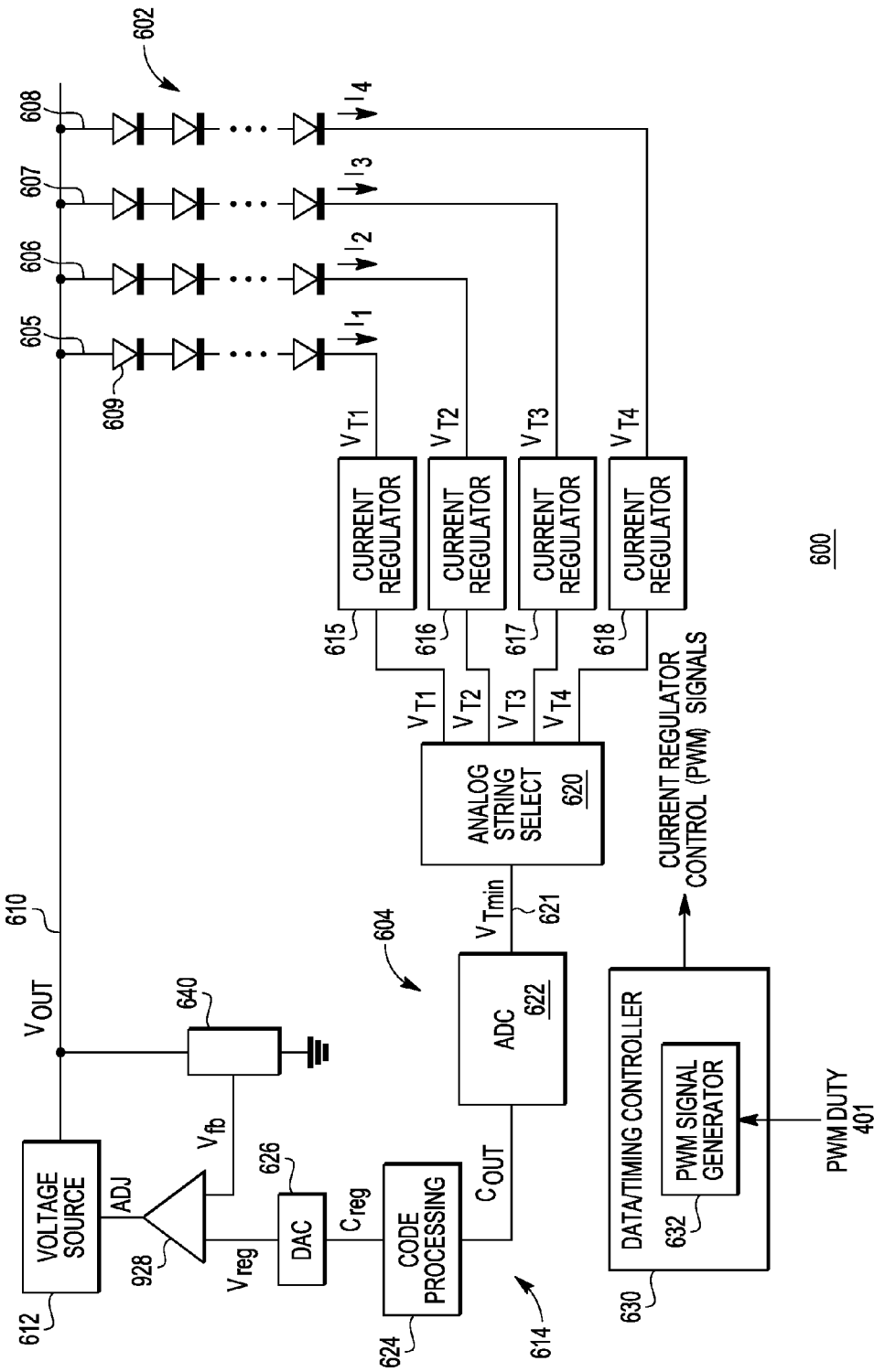
FIG. 6 is a diagram illustrating an example light emitting diode (LED) system implementing the PWM signal generator of FIG. 1 in accordance with at least one embodiment of the present invention.

FIG. 6 illustrates an example implementation of the PWM signal generator 100 of FIG. 1 for dynamic power management in a light emitting diode (LED) system 600 having a plurality of LED strings. The term "LED string," as used herein, refers to a grouping of one or more LEDs connected in series. The "head end" of a LED string is the end or portion of the LED string which receives the driving voltage/current and the "tail end" of the LED string is the opposite end or portion of the LED string. The term "tail voltage," as used herein, refers the voltage at the tail end of a LED string or representation thereof (e.g., a voltage-divided representation, an amplified representation, etc.). The term "subset of LED strings" refers to one or more LED strings.

In the depicted example, the LED system 600 includes a LED panel 602 and a LED driver 604. The LED panel 602 includes a plurality of LED strings (e.g., LED strings 605, 606, 607, and 608). Each LED string includes one or more LEDs 609 connected in series. The LEDs 609 can include, for example, white LEDs, red, green, blue (RGB) LEDs, organic LEDs (OLEDs), etc. Each LED string is driven by the adjustable voltage $V_{OUT}$ received at the head end of the LED string from a voltage source 612 of the LED driver 604 via a voltage bus 610 (e.g., a conductive trace, wire, etc.). In the embodiment of FIG. 6, the voltage source 612 is implemented as a DC/DC converter configured to drive the output voltage $V_{OUT}$ using a supplied input voltage.

The LED driver 604 includes a feedback controller 614 configured to control the voltage source 612 based on the tail voltages at the tail ends of the LED strings 605-608. The LED driver 604, in one embodiment, receives PWM duty values 601 (corresponding to the PWM duty value 101 of FIG. 1) that update or otherwise identifying the duty at which the LED strings 605-608 are to be driven, and the LED driver 604 is configured to activate the LED strings 605-608 based on the PWM duty value 601.

The feedback controller 614, in one embodiment, includes a plurality of current regulators (e.g., current regulators 615, 616, 617, and 618), an analog string select module 620, an ADC 622, a code processing module 624, a control digital-to-analog converter (DAC) 626, an error amplifier 628, and a data/timing controller 630. The data/timing controller 630 includes a PWM signal generator 632 (corresponding to the PWM signal generator 100, FIG. 1).

The current regulator 615 is configured to maintain the current $I_1$ flowing through the LED string 605 at or near a fixed current (e.g., 60 mA) when active. Likewise, the current regulators 616, 617, and 618 are configured to maintain the currents $I_2$, $I_3$, and $I_4$ flowing through the LED strings 606, 607, and 608, respectively, at or near the fixed current when active.

A current regulator typically operates more effectively when the input of the current regulator is a non-zero voltage so as to accommodate the variation in the input voltage that often results from the current regulation process of the current regulator. This buffering voltage often is referred to as the "headroom" of the current regulator. As the current regulators 615-618 are connected to the tail ends of the LED strings 605-608, respectively, the tail voltages of the LED strings 605-608 represent the amounts of headroom available at the corresponding current regulators 615-618. However, headroom in excess of that necessary for current regulation purposes results in unnecessary power consumption by the current regulator. Accordingly, as described in greater detail herein, the LED system 600 employs techniques to provide dynamic headroom control so as to maintain the minimum tail voltage of the active LED strings at or near a predetermined threshold voltage, thus maintaining the lowest headroom of the current regulators 615-618 at or near the predetermined threshold voltage. The threshold voltage can represent a determined balance between the need for sufficient headroom to permit proper current regulation by the current regulators 615-618 and the advantage of reduced power consumption by reducing the excess headroom at the current regulators 615-618.

The PWM signal generator 632 then generates a set of four output PWM signals in accordance with the techniques described above. Each output PWM signal is provided to a corresponding current regulator to control the activation of the corresponding LED strings. The analog string select module 620 includes a plurality of tail inputs coupled to the tail ends of the LED strings 605-608 to receive the tail voltages $V_{T1}$, $V_{T2}$, $V_{T3}$, and $V_{T4}$ of the LED strings 605-608, respectively, and an output to provide an analog signal 621 representative of the minimum tail voltage $V_{Tmin}$ of the LED strings 605-608 at any given point over a detection period. In one embodiment, the analog string select module 620 is implemented as a diode-OR circuit having a plurality of inputs connected to the tail ends of the LED strings 605-608 and an output to provide the analog signal 621.

The ADC 622 is configured to generate one or more digital code values $C_{OUT}$ representative of the voltage of the analog signal 621 at one or more corresponding sample points. The code processing module 624 includes an input to receive the one or more code values $C_{OUT}$ and an output to provide a code value $C_{reg}$ based on the minimum value of the received code values $C_{OUT}$ for a given detection period or a previous value for $C_{reg}$ from a previous detection period. As the code value $C_{OUT}$ represents the minimum tail voltage that occurred during the detection period (e.g., a PWM cycle, a display frame period, etc.) for all of the LED strings 605-608, the code processing module 624, in one embodiment, compares the code value $C_{OUT}$ to a threshold code value, $C_{thresh}$, and generates a code value $C_{reg}$ based on the comparison. The code processing module 624 can be implemented as hardware, software executed by one or more processors, or a combination thereof. To illustrate, the code processing module 624 can be implemented as a logic-based hardware state machine, software executed by a processor, and the like.

The control DAC 626 includes an input to receive the code value $C_{reg}$ and an output to provide a regulation voltage $V_{reg}$ representative of the code value $C_{reg}$. The regulation voltage $V_{reg}$ is provided to the error amplifier 628. The error amplifier 628 also receives a feedback voltage $V_{fb}$ representative of the output voltage $V_{OUT}$. In the illustrated embodiment, a voltage divider 640 is used to generate the voltage $V_{fb}$ from the output voltage $V_{OUT}$. The error amplifier 628 compares the voltage $V_{fb}$ and the voltage $V_{reg}$ and configures a signal ADJ based on this comparison. The voltage source 612 receives the signal ADJ and adjusts the output voltage $V_{OUT}$ based on the magnitude of the signal ADJ.

There may be considerable variation between the voltage drops across each of the LED strings 605-608 in the LED system 600 due to static variations in forward-voltage biases of the LEDs 609 of each LED string and dynamic variations due to the on/off cycling of the LEDs 609. Thus, there may be significant variance in the bias voltages needed to properly operate the LED strings 605-608. However, rather than drive a fixed output voltage $V_{OUT}$ that is substantially higher than what is needed for the smallest voltage drop as this is handled in conventional LED drivers, the LED driver 604 illustrated in FIG. 6 utilizes a feedback mechanism that permits the output voltage $V_{OUT}$ to be adjusted so as to reduce or minimize the power consumption of the LED driver 604 in the presence of variances in voltage drop across the LED strings 605-608.

In accordance with one aspect of the present disclosure, a system comprises a pulse width modulation (PWM) signal generator to generate a PWM signal. The PWM signal generator comprises a parameter control module to receive a duty value having N bits and to determine a value X from the M least significant bits of the duty value and determine a value Y from the N-M most significant bits of the duty value, the values X and Y comprising non-negative integers. The PWM signal generator further comprises a signal timing module to sequentially generate 2M PWM cycles for a cycle window of the PWM signal based on the duty value, wherein for each PWM cycle of the cycle window the signal timing module is to access a value D and to generate an active portion of the PWM cycle based on the value D. The PWM signal generator further comprises a window control module to adjust a cycle count value as PWM cycles are completed and to switch the value D used by the signal timing module between the value Y and a value Y+1 based on a relationship between the cycle count value and a threshold value. In one embodiment, the window control module initially sets the value D to the value Y+1 for the start of the cycle window and switches the value D to the value Y in response to the cycle count value reaching the threshold value. In another embodiment, the window control module initially sets the value D to the value Y for the start of the cycle window and switches the value D to the value Y+1 in response to the cycle count value reaching the threshold value. The system further may comprise a display device having an input to receive the PWM signal.

In one embodiment, the signal timing module comprises a counter to increment a count value based on a clock signal, and the signal timing module times the active portion of each PWM cycle based on a relationship between the count value and the value D. In one embodiment, the parameter control module is to determine a value for M based on N, a selected PWM cycle frequency, and a maximum implementable frequency for a clock signal used by the signal timing module to time the active portion of each PWM cycle of the cycle window.

In accordance with another aspect of the present disclosure, a method for generating a pulse width modulation (PWM) signal is provided. The method include receiving, at a PWM signal generator, a duty value having N bits and determining whether a PWM cycle frequency of the PWM signal is above or below a threshold that is based on a maximum implementable frequency of a timing clock signal used to time generation of PWM cycles for the PWM signal. The method further includes, in response to determining the PWM cycle frequency is below the threshold, configuring the PWM signal generator to generate for the PWM signal one or more PWM cycles having a duty represented by all N bits of the duty value. The method also includes, in response to determining the PWM cycle frequency is not below the threshold, configuring the PWM signal generator to generate for the PWM signal a series of PWM cycles, whereby the series includes a pattern of one or more PWM cycles having a duty Y and one or more PWM cycles having a duty Y+1, the duty Y based on a subset of the N bits of the duty value. In one embodiment, the pattern comprises a dithering pattern. In another embodiment, the pattern comprises a contiguous pattern whereby the one or more PWM cycles having the duty Y+1 are contiguous in the series.

In accordance with yet another aspect of the present disclosure, a method for generating a PWM signal is provided. The method includes receiving, at a PWM signal generator, a duty value having N bits and determining a value X from the M least significant bits of the duty value and determine a value Y from the N-M most significant bits of the duty value, the values X and Y comprising non-negative integers. The method further includes sequentially generating 2M PWM cycles for a cycle window of the PWM signal based on the duty value, wherein for each PWM cycle of the cycle window the PWM signal generator accesses a value D and generates an active portion of the PWM cycle based on the value D. The method also includes adjusting a cycle count value as PWM cycles are completed, and switching the value D accessed by the PWM signal generator between the value Y and a value Y+1 based on a relationship between the cycle count value and a threshold value. In one embodiment, the method also includes initially setting the value D to Y+1 for the start of the cycle window and wherein switching the value D comprises switching the value D to Y in response to the cycle count value reaching the threshold value. In another embodiment, the method includes initially setting the value D to Y for the start of the cycle window, and wherein switching the value D comprises switching the value D to Y+1 in response to the cycle count value reaching the threshold value.

In one embodiment, the method further includes incrementing a count value based on a clock signal and timing the active portion of each PWM cycle based on a relationship between the value D and the count value. The method also includes determining a value for M based on N, a selected PWM cycle frequency, and a maximum implementable frequency for the first clock signal.

In one embodiment, the duty value comprises a first duty value and the method further comprises receiving, at the PWM signal generator, a second duty value having N bits during the generation of the PWM cycles for the cycle window, the second duty value to replace the first duty value. In response to an occurrence of a frame boundary after receiving the second duty value, the method also includes determining, based on the second duty value, updated values for X and Y, implementing the updated values for X and Y for use in the generation of PWM cycles, and prematurely terminating a PWM cycle being generated at the occurrence of the frame boundary and initiating generation of a next PWM cycle.

In another embodiment, the duty value comprises a first duty value and the method further comprises receiving, at the PWM signal generator, a second duty value having N bits during the generation of the PWM cycles for the cycle window, the second duty value to replace the first duty value and determining, based on the second duty value, updated values for X and Y. In this instance, the method further includes implementing the updated values for X and Y for use in the generation of PWM cycles and in response to an occurrence of a frame boundary during the cycle window, prematurely terminating a PWM cycle being generated at the occurrence of the frame boundary and starting generation of a next PWM cycle.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A system comprising:
 a pulse width modulation (PWM) signal generator to generate a PWM signal, the PWM signal generator comprising:
  a parameter control module to receive a duty value having N bits and to determine a value X from the M least significant bits of the duty value and determine a value Y from the N-M most significant bits of the duty value, the values X and Y comprising non-negative integers;
  a signal timing module to sequentially generate, for a cycle window of the PWM signal, X contiguous PWM cycles having a duty represented by the value Y+1 and $2^M$-X contiguous PWM cycles having a duty represented by a value Y;
 wherein:
  the signal timing module comprises a counter to increment a count value based on a clock signal; and
  the signal timing module times an active portion of each PWM cycle based on the count value.

2. The system of claim 1, wherein the signal timing module generates the X contiguous PWM cycles having a duty represented by the value Y at the start of the cycle window.

3. The system of claim 1, wherein the signal timing module generates the $2^M$-X contiguous PWM cycles having a duty represented by the value Y+1 at the start of the cycle window.

4. The system of claim 1, further comprising:
 a display device having an input to receive the PWM signal, wherein the PWM signal is to drive a backlight of the display device.

5. A system comprising:
 a pulse width modulation (PWM) signal generator to generate a PWM signal, the PWM signal generator comprising:
  a parameter control module to receive a duty value having N bits and to determine a value X from the M least significant bits of the duty value and determine a value Y from the N-M most significant bits of the duty value, the values X and Y comprising non-negative integers;
  a signal timing module to sequentially generate, for a cycle window of the PWM signal, X contiguous PWM cycles having a duty represented by the value Y+1 and $2^M$-X contiguous PWM cycles having a duty represented by a value Y;
 wherein the parameter control module is to determine a value for M based on N, a selected PWM cycle frequency, and a maximum implementable frequency for a clock signal used by the signal timing module to time the each PWM cycle of the cycle window.

6. The system of claim 5, wherein:
 the signal timing module comprises a counter to increment a count value based on a clock signal; and
 the signal timing module times an active portion of each PWM cycle based on the count value.

7. The system of claim 5, wherein the parameter control module is to select a value for M from a range determined based on calculations representing an expression:

$$\frac{\log\left(\frac{f\_pwm}{vis\_thresh}\right)}{\log(2)} > M \geq N - \frac{\log\left(\frac{f\_res\_max}{f\_pwm}\right)}{\log(2)}$$

whereby f_res_max represents the maximum implementable frequency, vis_thresh represents a predetermined minimum frequency threshold, and f_pwm represents the selected PWM cycle frequency.

8. A method for generating a pulse width modulation (PWM) signal, the method comprising:
 receiving, at a PWM signal generator, a duty value having N bits;
 determining whether a PWM cycle frequency of the PWM signal is above or below a threshold that is based on a maximum implementable frequency of a timing clock signal used to time generation of PWM cycles for the PWM signal;
 in response to determining the PWM cycle frequency is below the threshold, configuring the PWM signal generator to generate for the PWM signal one or more PWM cycles having a duty represented by all N bits of the duty value; and
 in response to determining the PWM cycle frequency is not below the threshold, configuring the PWM signal generator to generate for the PWM signal a series of PWM cycles, whereby the series includes a pattern of one or more PWM cycles having a duty Y and one or more PWM cycles having a duty Y+1, the duty Y based on a subset of the N bits of the duty value.

9. The method of claim 8, wherein the pattern comprises a dithering pattern.

10. The method of claim 8, wherein the pattern comprises a contiguous pattern whereby the one or more PWM cycles having the duty Y+1 are contiguous in the series.

11. The method of claim 10, wherein a number M of bits in the subset of the N bits of the duty value is selected from a range determined based on calculations representing an expression:

$$\frac{\log\left(\frac{f\_pwm}{vis\_thresh}\right)}{\log(2)} > M \geq N - \frac{\log\left(\frac{f\_res\_max}{f\_pwm}\right)}{\log(2)}$$

whereby f_res_max represents the maximum implementable frequency, vis_thresh represents a predetermined minimum frequency threshold, and f_pwm represents the PWM cycle frequency.

12. The method of claim 8, wherein the threshold is determined based on calculations represented by an expression:

$$threshold \geq \frac{f\_res\_max}{2^N - 1}$$

whereby f_res_max represents the maximum implementable frequency of the timing clock signal.

13. A method for generating a pulse width modulation (PWM) signal, the method comprising:
  receiving, at a PWM signal generator, a duty value having N bits;
  determining a value X from the M least significant bits of the duty value and determine a value Y from the N-M most significant bits of the duty value, the values X and Y comprising non-negative integers;
  sequentially generating, for a cycle window of the PWM signal, X contiguous PWM cycles having a duty represented by the value Y+1 and $2^M$-X contiguous PWM cycles having a duty represented by a value Y;
  incrementing a count value based on a clock signal; and
  timing an active portion of each PWM cycle based on the count value.

14. The method of claim 13, wherein the $2^X$ contiguous PWM cycles having a duty represented by the value Y are generated at a start of the cycle window.

15. The method of claim 13, wherein the $2^M$-X contiguous PWM cycles having a duty represented by the value Y+1 are generated at a start of the cycle window.

16. A method for generating a pulse width modulation (PWM) signal, the method comprising:
  receiving, at a PWM signal generator, a duty value having N bits;
  determining a value X from the M least significant bits of the duty value and determine a value Y from the N-M most significant bits of the duty value, the values X and Y comprising non-negative integers;
  sequentially generating, for a cycle window of the PWM signal, X contiguous PWM cycles having a duty represented by the value Y+1 and 2M-X contiguous PWM cycles having a duty represented by a value Y;
  determining a value for M based on N, a selected PWM cycle frequency, and a maximum implementable frequency for the first clock signal.

17. The method of claim 16, further comprising:
  incrementing a count value based on a clock signal; and
  timing an active portion of each PWM cycle based on the count value.

18. The method of claim 16, wherein determining the value M comprises selecting the value M by performing, at the PWM signal generator, calculations representing an expression:

$$\frac{\log\left(\frac{f\_pwm}{vis\_thresh}\right)}{\log(2)} > M \geq N - \frac{\log\left(\frac{f\_res\_max}{f\_pwm}\right)}{\log(2)}$$

whereby f_res_max represents the maximum implementable frequency, vis_thresh represents a predetermined minimum frequency threshold, and f_pwm represents the selected PWM cycle frequency.

19. A method for generating a pulse width modulation (PWM) signal, the method comprising:
  receiving, at a PWM signal generator, a duty value having N bits;
  determining a value X from the M least significant bits of the duty value and determine a value Y from the N-M most significant bits of the duty value, the values X and Y comprising non-negative integers;
  sequentially generating, for a cycle window of the PWM signal, X contiguous PWM cycles having a duty represented by the value Y+1 and 2M-X contiguous PWM cycles having a duty represented by a value Y;
  wherein the duty value comprises a first duty value and the method further comprises:
    receiving, at the PWM signal generator, a second duty value having N bits during the generation of the PWM cycles for the cycle window, the second duty value to replace the first duty value;
    in response to an occurrence of a frame boundary after receiving the second duty value:
      determining, based on the second duty value, updated values for X and Y;
      implementing the updated values for X and Y for use in the generation of PWM cycles; and
      terminating a PWM cycle being generated at the occurrence of the frame boundary and initiating generation of a next PWM cycle.

20. A method for generating a pulse width modulation (PWM) signal, the method comprising:
  receiving, at a PWM signal generator, a duty value having N bits;
  determining a value X from the M least significant bits of the duty value and determine a value Y from the N-M most significant bits of the duty value, the values X and Y comprising non-negative integers;
  sequentially generating, for a cycle window of the PWM signal, X contiguous PWM cycles having a duty represented by the value Y+1 and 2M-X contiguous PWM cycles having a duty represented by a value Y;
  wherein the duty value comprises a first duty value and the method further comprises:
    receiving, at the PWM signal generator, a second duty value having N bits during the generation of the PWM cycles for the cycle window, the second duty value to replace the first duty value;

determining, based on the second duty value, updated values for X and Y;

implementing the updated values for X and Y for use in the generation of PWM cycles; and in response to an occurrence of a frame boundary during the cycle window, terminating a PWM cycle being generated at the occurrence of the frame boundary and starting generation of a next PWM cycle.

* * * * *